United States Patent
Acharya

(10) Patent No.: US 7,053,681 B2
(45) Date of Patent: May 30, 2006

(54) COMPARATOR AND METHOD FOR AMPLIFYING AN INPUT SIGNAL

(75) Inventor: Pramod Acharya, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/863,516

(22) Filed: Jun. 9, 2004

(65) Prior Publication Data

US 2005/0275434 A1 Dec. 15, 2005

(51) Int. Cl.
*H03B 1/00* (2006.01)

(52) U.S. Cl. ..................... 327/112; 327/313

(58) Field of Classification Search ............... 327/50, 327/78, 80, 123, 313, 327, 28, 377
See application file for complete search history.

(56) References Cited

U.S. PATENT DOCUMENTS

| 3,581,110 A | * | 5/1971 | Belcastro ................ 327/310 |
| 3,649,846 A | * | 3/1972 | Frederiksen ............... 327/88 |
| 3,932,773 A | * | 1/1976 | Luscher et al. ............ 327/112 |
| 4,491,748 A | * | 1/1985 | Chappell et al. ........... 327/112 |
| 5,391,937 A | * | 2/1995 | Baggini et al. ............. 327/78 |
| 5,614,851 A | * | 3/1997 | Holzer et al. ............... 327/58 |

* cited by examiner

*Primary Examiner*—Terry D. Cunningham
*Assistant Examiner*—Thomas J. Hiltunen
(74) *Attorney, Agent, or Firm*—Morrison & Foerster LLP

(57) ABSTRACT

The invention is aimed at providing a novel semi-conductor component, as well as a novel process for reading test data. There is a process for reading test data is made available, including reading test data generated during a semi-conductor component test procedure from at least one test data register of a semi-conductor component, storing the test data in at least one useful data memory cell provided on the semi-conductor component, and reading the test data from the at least one useful data memory cell.

10 Claims, 3 Drawing Sheets

COMPARATOR AND METHOD FOR AMPLIFYING AN INPUT SIGNAL

TECHNICAL FIELD OF THE INVENTION

The invention refers to a comparator, and in particular, to a comparator for amplifying an interface signal at an input of a semiconductor chip, and to a method for amplifying an input signal without the aid of an explicit reference signal.

BACKGROUND OF THE INVENTION

In conventional semiconductor chips, e.g., respective memory chips, processors, etc., etc., for amplifying an interface signal at an input of the chip, a reference voltage is derived from a supply voltage (e.g. by the use of a voltage divider, and/or a diode, etc.).

In conventional comparators, the level of the reference voltage or quiscent point might be compared with the voltage level of the interface signal at the input of the chip. The comparison circuit must detect and then amplify rail-to-rail voltage changes as set by specification. For example, in "High Type" terminated systems, the quiscent point or reference voltage is defined as 70% of the supply voltage and the minimum level the comparator must be able to distinguish could be +−200 mV around this reference voltage. The maximum swing, however, is determined by the termination resistors used in the system.

Depending on the result of the comparison, in particular, depending on whether or not the voltage level of the interface signal is above or below the reference voltage level, a respective (amplified) "logic high", or a respective "logic low" signal is output (or the other way round). Thereby, respective operational amplifiers might be used.

Typically, the comparator circuit is realised using a source coupled pair with a constant current sink/source.

Hence, in conventional semiconductor chips, the interface signal generally is amplified in the voltage domain.

However, variations in process, voltage, temperature and variations in the above reference voltage (due to switching noise, dc drift, etc.) might lead to a relatively bad quality of the output signal, e.g., might have a negative impact on the small set-up and hold times, etc., etc.

Such effects are especially problematic, and are especially difficult to control when the interface signal changes its state with a relatively high frequency (e.g., 500 MHz and more).

SUMMARY OF THE INVENTION

The invention discloses a comparator, and a method for amplifying a signal, in particular, an interface signal at an input of a semiconductor chip.

According to one embodiment of the invention, there is a method for amplifying an input signal including:

providing, by use of a first current source/sink, a first current to an output node;

sinking, by use of a third current source/sink, a third current from the output node; and inputting the input signal to a control input of the third current source/sink;

whereby a control input of the first current source/sink is connected to the third current source/sink, such that an output node load capacitance, representing a second current source/sink, is rapidly charged when the input signal changes its state in a first direction, and is rapidly discharged when the input signal changes its state in a second direction.

Advantageously, a control input of the first current source/sink is connected to the third current source/sink, by a clamping capacitor, and additionally by the input via a feed forward capacitor, or an additional capacitor for AC (or dynamic) coupling of the input, such that an output node load capacitance, representing a second current source/sink, is rapidly charged when the input signal changes its state in a first direction, and is rapidly discharged when the input signal changes its state in a second direction.

Advantageously, when the node load capacitance is rapidly charged, an output signal changes its state in a first direction, and, when the node load capacitance is rapidly discharged, the output signal changes its state in a second direction.

Advantageously, the clamping capacitor is coupled to a resistor. The use of a resistor to locally bias the comparator might be preferred to the use of a transiator biased in the saturation region. Local bias minimizes performance uncertanities arising due to unstable bias and noise coupling on the bias line, which may need to be routed from a far away bias source.

With the comparator as provided according to the invention, important design metrics might be optimized viz. signal propagation delay and signal rise—comparator rise, signal fall—comparator fall mismatch, etc.

BRIEF DESCRIPTION OF THE DRAWINGS

These and other features, aspects and advantages of the present invention will be more fully understood when considered with respect to the following detailed description, appended claims and accompanying drawings, wherein:

DETAILED DESCRIPTION OF THE INVENTION

Figure 1:
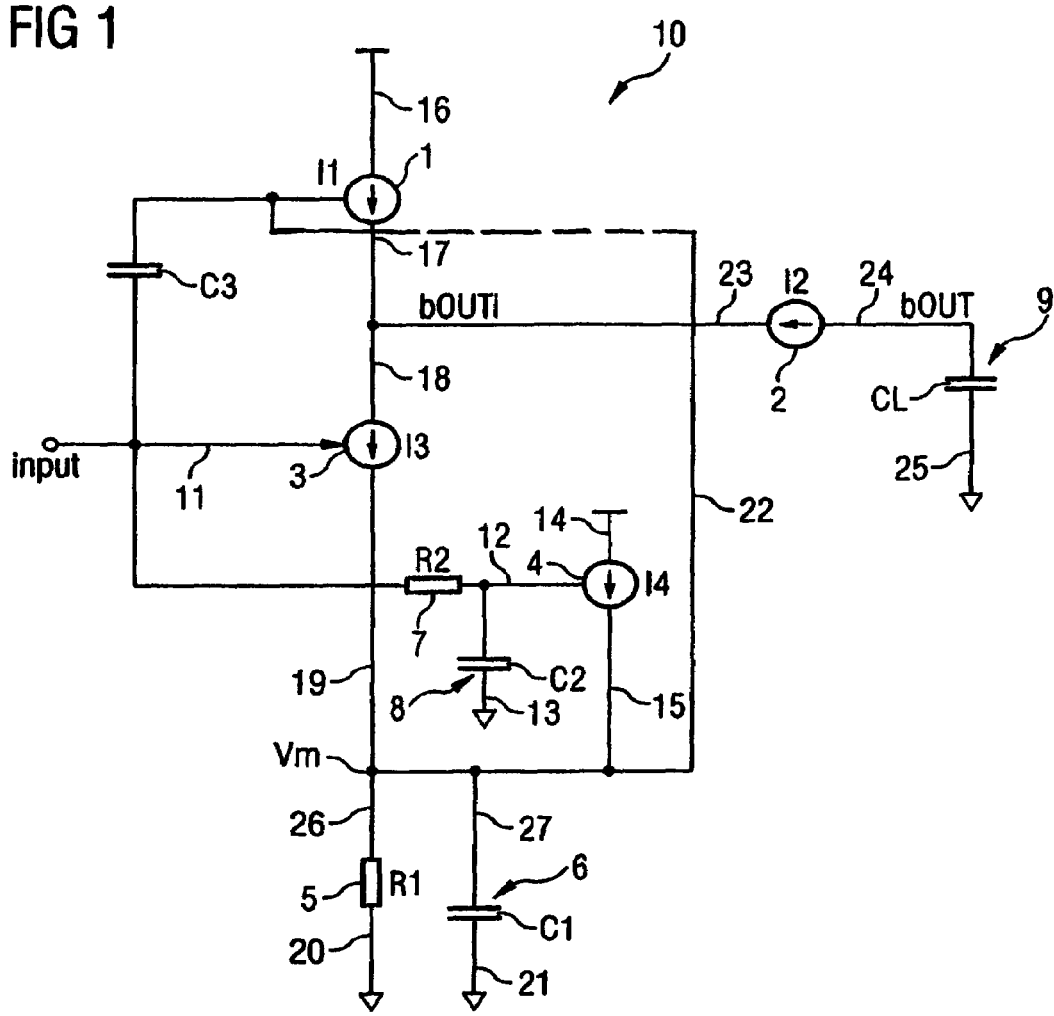
FIG. 1 shows a block diagram representing an exemplary comparator according to an embodiment of the invention.

In FIG. 1, there is a block diagram representing an comparator according to an embodiment of the invention.

The comparator 10 may be used to amplify an interface signal input into an input (e.g., a respective pin) of a semiconductor chip, e.g., a memory chip, or a processor, etc., etc., or any other kind of (internal or external) signal input into the comparator 10 at an input line 11.

As is shown in FIG. 1, and as will be described in further detail below, the comparator according to the embodiment of the invention makes use of four different current sources/current sinks 1, 2, 3, 4, providing/sinking a current of I1, I2, I3 and I4, respectively.

The changes in the voltage level of the above input signal at the input line 11 might be relatively low.

The comparator 10 serves to amplify the input signal, and to output a respective, corresponding signal (more particular: an output signal bOUT inverse to the input signal) at an output line 24, which might have a higher voltage level, than the input signal.

According to FIG. 1, the input line 11 is connected to a control input (here: a gate) of the above (third)—here: a variable—current source/sink 3.

As is further shown in FIG. 1, in addition, the (third) current source/sink 3 (in particular, a drain of the (third) current source/sink 3) is connected to a line 18. Further, the (third) current source/sink (in particular, a source of the (third) current source/sink) is connected to a line 19.

The line 19—via a line 26—is connected to a resistor 5 (here, as will be described in further detail below, a discharge/local bias setting resistor), which—via a line 20—is coupled to ground. Further, the line 19—via a line 27—is connected with a capacitor 6 (which, as will be described in further detail below, is used as clamping capacitance), the capacitor 6 also being coupled to the ground (here: via a line 21).

In addition to the above lines 26, 27, the line 19—via a line 22—is connected to a control input (here: a gate) of the above (first)—here: a quasi-fixed—current source/sink 1 (hence, a voltage Vm present at the above lines 19, 26, 27 (i.e., at the source of the (third) current source 3) is fed to the control input (gate) of the first current source/sink 1).

In addition, the (first) current source/sink 1 is connected to a line 16 coupled to a supply voltage, and to a line 17, which is connected to the above line 18 (i.e., to the drain of the third current source/sink 3). Further, this current source/ sink 1 is controlled by dynamically feeding forward the input signal, via a coupling capacitor C3.

As further shown in FIG. 1, the input line 11—in addition to the control input (here: the gate) of the above (third) current source/sink 3—is coupled (via a resistor 7, providing a "delay resistance" (see below), and a line 12) to a control input (here: a gate) of the above (fourth) current source/sink 4 (here: a variable current source, the strength of which is dependent on the level of the input signal (see below)).

In addition, a capacitor 8 (providing a "delay capacitance" (see below))—which via a line 13 is coupled to ground—is also connected with the line 12 (i.e., is also coupled to the control input (here: the gate) of the above (fourth) current source/sink 4).

Further, the (fourth) current source/sink 4 is connected to a line 14 coupled to the supply voltage, and to a line 15, which is connected to the lines 19 and 22 and 26 and 27.

The above lines 17, 18 are coupled to a line 23 to which an internal output signal bOUTi is output, which—as will be described in further detail below—corresponds to the input signal at the above input line 11, but which is inverse thereto, and amplified. As will be described in further detail below, the (internal output) line 23 is coupled with the above (second) current source/sink 2 (here, a "load current source/ sink"), and the above output line 24.

Further, FIG. 1 shows a capacitor 9 coupled between the output line 24, and the ground, which represents the capacitance of the load coupled to the output of the comparator (e.g., of respective elements to which the output signal bOUT is supplied, and of a respective inverting receiver circuit 29 coupled between the output lines 23, 24, etc. (see below, and FIG. 2)).

As shown in FIG. 1, the above voltage Vm present at the above lines 19, 26, 27 ("bias voltage") is set by the combination of the value of the resistance R1 of the resistor 5 and the current flowing thereto, i.e., the current provided by—mainly—the (first and third) current sources 1, 3 (as well as the current provided and/or sunk by the further current sources/sinks 4, 2). This circuit topology has advantages with respect to bias setting (e.g., uses minimal bias current), robustness against supply voltage, process and temperature drifts.

The third current source/sink 3 is controlled by the input signal present at the input line 11, more particular, by the voltage level (Vinp) of the input signal (particularely, the Gate-Source voltage (Vinp-Vm) present between the gate and the source of the third current source/sink 3).

If, for instance in a high type termination system, the input signal changes its state from "logic low" to "logic high"—in particular, makes a minimum specified change in the positive direction—the current sunk by the third current source/ sink 3 is increased.

In a conventional source coupled pair, in response to a level change, the Vm node follows the input signal till the input falls below the reference signal. During this time, the (Vinp-Vm) value remains constant and so does the switching current. This results in a slowdown of the overall switching operation.

However, in the above circuit topology as e.g. shown in FIG. 1, due to the capacitance C1 of the capacitor 6—the above voltage Vm present at the above lines 19, 26, 27 (i.e., the voltage across the resistor 5, and the capacitor 6)—set, as said, inter alia, by the current source/sink 3—cannot change instantaneously, i.e., will follow the above transition of the input signal with a small delay, as may be calculated by the time constant R1C1 of the resistor 5/capacitor 6.

Hence, the (third) current source/sink 3 "demands" more current, which e.g. the (first) current source/sink 1 cannot supply (or, more particularly, cannot supply completely) for two reasons: (1) the above voltage Vm present at the above lines 19, 26, 27 (i.e., the voltage across the resistor 5, and the capacitor 6) as said, provided to the gate of the (first) current source/sink 1 via the line 22 "clamps" the gate of the (first) current source/sink 1; (2) The feed forward of the input signal via the coupling capacitance C3 pinches it off further. The (fourth) current source/sink 4 cannot source much (additional) current either, as the bias of the input signal is too high for it to be effective. Therefore, the above "excess" current "demanded" by the (third) current source/sink 3 can be (fully) provided is by discharging the load capacitor 9 (which such serves as a "current source", represented by the second current source/sink 2 shown in FIG. 2). Hence, the voltage level of the output signal bOUT present at the output line 24 sinks rapidly.

If, on the other hand, the input signal again changes its state from "logic high" to "logic low"—in particular, makes a specified minimum change in the negative direction—the current sunk by the third current source/sink 3 is decreased.

Again, due to the capacitance C1 of the capacitor 6, the current source/sink 3 is pinched off and simultaneously, because of C3 coupling the input transition, the current source 1 is enhanced. Since the (third) current source/sink 3 "demands" less current, the excess current that can be supplied by I1 is sourced to the load capacitor 9. Hence, the capacitor 9 is charged rapidly (which such serves as a "current sink", represented by the second current source/ sink 2 shown in FIG. 2). Once again, the (fourth) current source/sink 4 cannot source much (additional) current either, as the bias of the input signal is too high for it to be effective. Therefore, the voltage level of the output signal bOUT present at the output line 24 increases rapidly.

Hence, the comparator 10 rapidly amplifies the input signal present at the input line 11 into a corresponding, inverse output signal bOUT at the output line 24.

As becomes clear from above, as long as the transitions occur around the voltage reference level, the amplification is performed in the current domain, and not in the voltage domain; further, no reference voltage is needed.

Therefore, a fast, self-biased, frequency-independent, supply robust current amplifying is achieved, e.g. reducing the set-up/hold time variations caused by process, voltage, temperature and noise in a reference voltage used in conventional comparators, etc.

The AC (or feed forward) coupling improves the response of the Comparator significantly, but there is the danger of false switching if the input signal swings below the reference level are very large. To prevent a change in the output when events such as described above occur, the Comparator 10 is provided with a "switch protector" or "(proportional) slew limiter", here: the above (fourth, alternative) current source/sink 4, controlled by an RC combination, namely, the above resistor 7, and the above capacitor 8.

When the changes of the input signal are big, especially well below the reference, as described above, the additional (or lower amount of) current "demanded" by the (third) current source/sink 3 (resulting from a change of the voltage level Vinp of the input signal) is not provided (or sunk) by the capacitor 9 (i.e., the "second current source/sink 2"), but by the—alternative—(fourth) current source/sink 4 which becomes a strong current source as the input signal goes lower; hence, the output signal does not switch.

In other words, the output signal only switches when it has to, i.e., when the changes of the voltage level Vinp of the input signal are around the reference voltage. For example, as the voltage level Vinp of the input signal falls lower, the (fourth) current source/sink 4 turns on harder. Now with any sudden transition of the input signal towards the reference (see below), the node controlling the (fourth) current source/sink 4 (particularely, the voltage present on the line 12) follows slower. Hence, the (fourth) current source/sink 4 supplies the additional current needed by the (third) current source/sink 3, in turn preventing the load current, and hence the load voltage, from being disturbed or switching.

Figure 2:
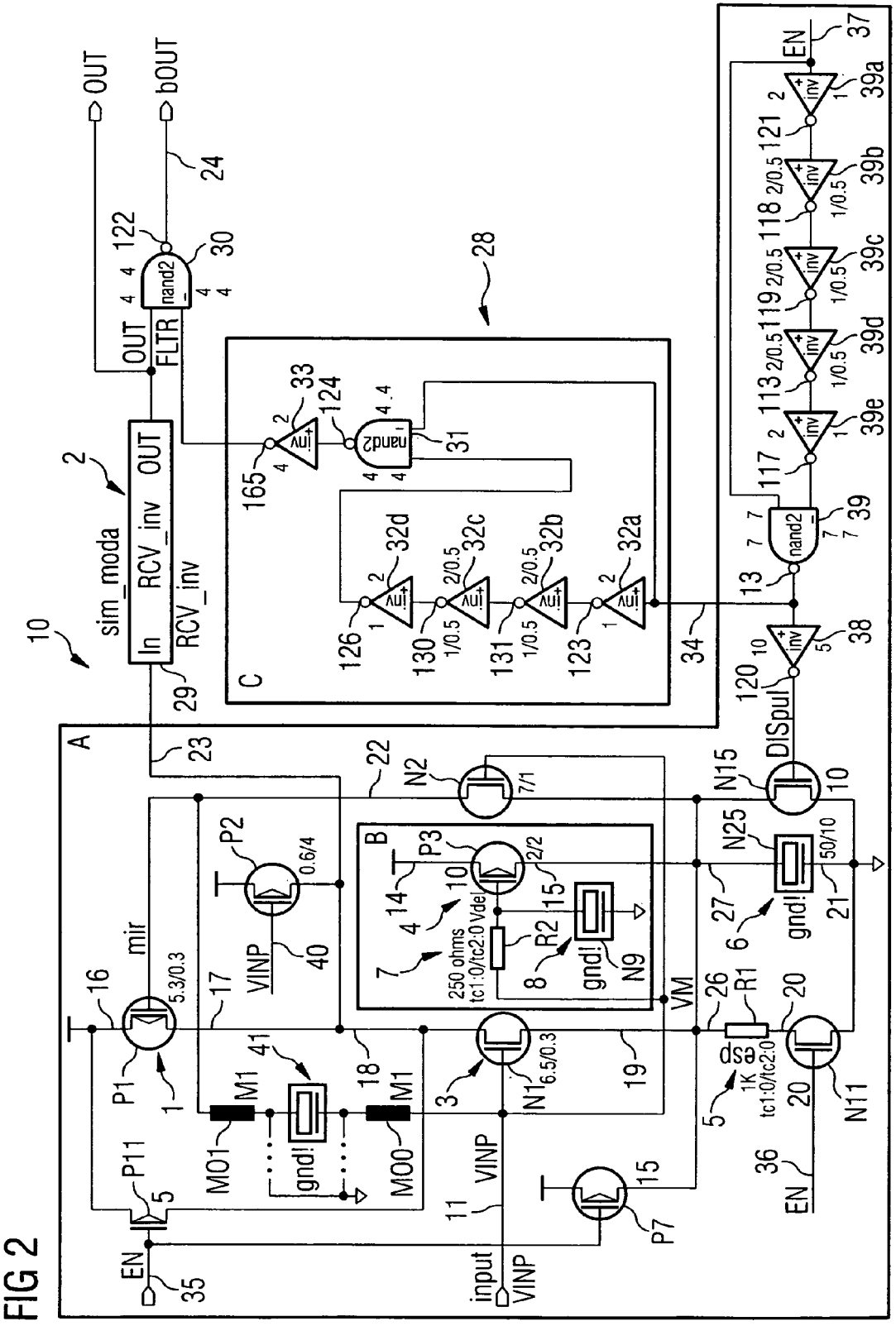
FIG. 2 is a circuit diagram of a comparator according to an embodiment of the invention.

FIG. 2 shows a more detailed circuit diagram of the comparator 10 shown in FIG. 1.

As shown in FIG. 2, the first (quasi-fixed) current source/sink 1 comprises a p-channel MOSFET (P1), the second current source/sink 2 ("load current source/sink"), inter alia, the above inverting receiver circuit 29, and a NAND-Gate 30, the third (variable) current source/sink 3 a n-channel MOSFET (N1), and the fourth current source/sink 4 (i.e., the variable, input voltage level (Vinp) dependant current source) a p-channel MOSFET (P3).

In addition, the comparator 10 comprises a glitch filter 28, comprising several inverters 32a, 32b, 32c, 32d coupled in a row, a NAND-Gate 31, and a further inverter 33. A signal present at a line 34, and input into the glitch filter 28 is provided to the first inverter 32a of the row of inverters 32a, 32b, 32c, 32d and to a first input of the NAND-Gate 31. As can be seen from FIG. 2, a signal output by the last inverter 32d of the row of inverters 32a, 32b, 32c, 32d is input into a second input of the NAND-Gate 31, the output of which is input into the further inverter 33.

To activate the comparator 10, an enable signal EN is input at enable lines 35, 36, 37, and input, inter alia, into a gate of a p-channel MOSFET (P11), a gate of a p-channel MOSFET (P7), and a gate of a n-channel MOSFET (N11).

A drain of the n-channel MOSFET (N11) is coupled—via the above line 20—to the above resistor 5, and a source of the n-channel MOSFET (N11) is coupled—via the above line 21—to the above capacitor 6, to the supply voltage, and to a source of a n-channel MOSFET (N15).

A gate of the n-channel MOSFET (N15) is coupled—via an inverter 38—to the above line 34, and to an output of a NAND-Gate 39. A drain of the n-channel MOSFET (N15) is coupled to the above lines 19, 26, 27.

As shown in FIG. 2, the enable line 37 is coupled to a pulse generator, sensitive to a rising edge, which is realized by the first inverter 39a of several inverters 39a, 39b, 39c, 39d, 39e coupled in a row, and to a first input of the NAND-Gate 39. A signal output by the last inverter 39e of the row of inverters 39a, 39b, 39c, 39d, 39e is input into a second input of the NAND-Gate 39. A drain of the p-channel MOSFET P7 is coupled to the above lines 26, 27, 19, and a source of the p-channel MOSFET P7 is coupled to ground.

Further, a source of the p-channel MOSFET P11 is coupled to the above line 16, and to ground, and a drain of the p-channel MOSFET P11 is coupled to the above line 18. A gate of an n-channel MOSFET N2 is coupled to the above line 11, a source of the n-channel MOSFET N2 to the drain of the n-channel MOSFET N15, and a drain of the n-channel MOSFET N2 to the above line 22. A source of a further p-channel MOSFET P2 is coupled to the supply voltage, and a drain of the further p-channel MOSFET P2 is coupled to the above lines 17, 18, 23.

As shown in FIG. 2, a gate of the further p-channel MOSFET P2 is coupled with a line 40, to which the above input signal having the above voltage level Vinp is applied. The weak p-channel MOSFET P2 prevents the node on which the above output signal bOUTi is present from floating in case the input signal is driven completely to ground.

The biasing provided by the above current source/sink 1 (in particular, the p-channel MOSFET P1), the above current source/sink 3 (in particular, the n-channel MOSFET N1) and the resistor 5 is such that a voltage level of about 0.7× SUPPLY VOLTAGE constitutes the bias point, so that the comparator 10 is most sensitive to changes of the input signal around this voltage level. The above n-channel MOSFET N2 serves the dual purpose of passing Vm to DC bias P1 as well as decouple it for the dynamic feed forward of the input signal via C3. The feed forward mechanism is used to control the current sourcing capability of the p-channel MOSFET P1, making use of the slew rate of the input signal to improve the switching time of the comparator 10 significantly.

When the comparator 10 is disabled/deactivated to safe power, i.e., when EN=logic low is present on the enable lines 35, 36, 37, the (clamping) capacitor 6 is charged till the voltage across its inputs reaches the level of the above supply voltage. When the comparator 10 is enabled/activated, the capacitor 6 needs to discharge rapidly. This is done by generating a discharge pulse using the rising edge of the enable signal EN.

Figure 3:
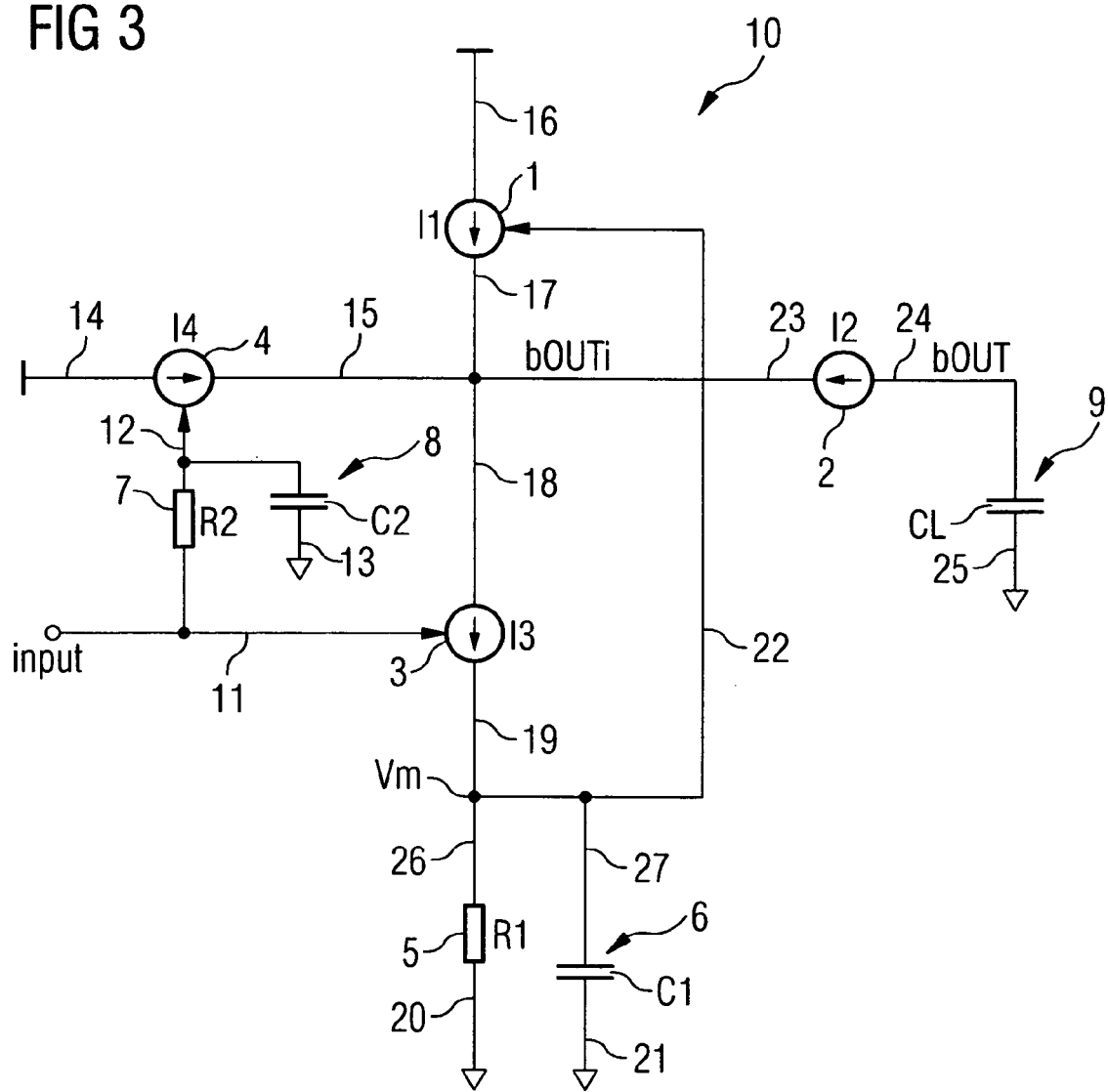
FIG. 3 is a block diagram representing an comparator according to an alternative embodiment of the invention.

FIG. 3 is a block diagram showing a comparator according to an alternative embodiment of the invention, similar to that described with respect to the above FIGS. 1 and 2.

The comparator 10 may be used to amplify an interface signal input into an input (e.g., a respective pin) of a semiconductor chip, e.g., a memory chip, or a processor, etc., etc., or any other kind of (internal or external) signal input into the comparator 10 at an input line 11.

As shown in FIG. 3, and similar to the comparator shown in FIG. 1, the comparator according to the alternative embodiment of the invention makes use of four different current sources/current sinks 1, 2, 3, 4, providing/sinking a current of I1, I2, I3 and I4, respectively.

The changes in the voltage level of the above input signal at the input line 11 might be relatively low.

The comparator 10—similar to the comparator shown in FIGS. 1 and 2, and again without the aid of an explicit reference signal—amplifies the input signal, and outputs a respective, corresponding signal (more particular: an output signal bOUT inverse to the input signal) at an output line 24, which might have a higher voltage level, than the input signal.

While exemplary embodiments have been described in detail and shown in the accompanying drawings, it is to be understood that such embodiments are merely illustrative of and not restrictive on the broad invention. It will thus be recognized that various modifications may be made to the illustrated and other embodiments of the invention, without departing from the scope and spirit of the invention as defined by the appended claims.

What is claimed is:

1. A method for amplifying an input signal, comprising:
   providing, by use of a first current source/sink, a first current to an output node;
   sinking, by use of a third current source/sink, a third current from the output node; and
   inputting the input signal to a control input of the third current source/sink,
   wherein a control input of the first current source/sink is connected to the third current source/sink, and to a clamping capacitor, such that an output node load capacitance, representing a second current source/sink, is rapidly charged when the input signal changes its state in a first direction, and is rapidly discharged when the input signal changes its state in a second direction, wherein
   when the node load capacitance is rapidly charged, an output signal changes its state in a first direction, and, when the node load capacitance is rapidly discharged, the output signal changes its state in the second direction,
   the clamping capacitor is coupled to a resistor,
   providing, by use of a fourth current source/sink, a fourth current to the output node,
   a signal derived from the input signal is input to a control input of the fourth current source/sink, and
   when the input signal changes are relatively small, and/or relatively large and below a reference voltage, the changes in the current provided by the fourth current source/sink prevent the output signal from changing its state.

2. A comparator, comprising:
   a first current source/sink, coupled to an output node; and
   a third current source/sink, coupled to the output node, wherein a control input of the third current source/sink is coupled to a signal input line, and
   a control input of the first current source/sink is connected to the third current source/sink and a clamping capacitor, such that an output node load capacitance, representing a second current source/sink, is rapidly charged when a signal at the signal input line changes its state in a first direction, and is rapidly discharged when the signal at the signal input line changes its state in a second direction, wherein
   the control input of the first current source/sink is additionally connected to a feed forward capacitor.

3. The comparator of claim 2, wherein the clamping capacitor is coupled to a resistor.

4. The comparator of claim 2, wherein the output node is coupled to an inverter.

5. The comparator of claim 2, further comprising a fourth current source/sink.

6. The comparator of claim 5, wherein the fourth current source/sink is coupled to the output node.

7. The comparator of claim 5, wherein the fourth current source/sink via a resistor is coupled to the signal input line.

8. The comparator of claim 5, wherein the resistor is coupled to a capacitor.

9. A method for amplifying an input signal, comprising:
   providing, by use of a first current source/sink, a first current to an output node;
   sinking, by use of a third current source/sink, a third current from the output node; and
   inputting the input signal to a control input of the third current source/sink,
   wherein a control input of the first current source/sink is connected to the third current source/sink, at a clamping capacitor and additionally by the input via a feed forward capacitor, such that an output node load capacitance, representing a second current source/sink, is rapidly charged when the input signal changes its state in a first direction, and is rapidly discharged when the input signal changes its state in a second direction.

10. The method of claim 9, wherein the input signal is additionally input to a control input of the first current source/sink.

* * * * *